(12) United States Patent
Feldman-Peabody et al.

(10) Patent No.: US 9,555,502 B2
(45) Date of Patent: Jan. 31, 2017

(54) DUAL LASERS FOR REMOVING GLASS-SIDE DEBRIS DURING THE MANUFACTURE OF THIN FILM PHOTOVOLTAIC DEVICES

(75) Inventors: Scott Daniel Feldman-Peabody, Golden, CO (US); William J. Schaffer, Atascadero, CA (US)

(73) Assignee: First Solar, Inc., Tempe, AZ (US)

( * ) Notice: Subject to any disclaimer, the term of this patent is extended or adjusted under 35 U.S.C. 154(b) by 1133 days.

(21) Appl. No.: 13/560,354

(22) Filed: Jul. 27, 2012

(65) Prior Publication Data

US 2014/0027420 A1   Jan. 30, 2014

(51) Int. Cl.
| | | |
|---|---|---|
| B23K 26/00 | (2014.01) | |
| H01L 21/00 | (2006.01) | |
| B23K 26/06 | (2014.01) | |
| H01L 31/073 | (2012.01) | |
| H01L 31/0463 | (2014.01) | |
| B23K 26/40 | (2014.01) | |

(52) U.S. Cl.
CPC ....... B23K 26/0063 (2013.01); B23K 26/0608 (2013.01); B23K 26/0617 (2013.01); B23K 26/364 (2015.10); B23K 26/40 (2013.01); H01L 31/0463 (2014.12); H01L 31/073 (2013.01); *B23K 2203/172* (2015.10); *Y02E 10/543* (2013.01)

(58) Field of Classification Search
CPC .............. H01L 31/0463; H01L 31/073; B23K 26/0063; B23K 26/0608; B23K 26/0617; B23K 26/367; B23K 26/409; B23K 26/16; B23K 26/0039–26/0045
USPC .............. 219/121.6, 121.61, 121.67–121.69, 219/121.76, 121.77; 438/460, 462, 463
See application file for complete search history.

(56) References Cited

U.S. PATENT DOCUMENTS

| | | | |
|---|---|---|---|
| 6,858,461 B2 | 2/2005 | Oswald et al. | |
| 7,682,970 B2 | 3/2010 | Grigoropoulos et al. | |
| 7,833,808 B2 | 11/2010 | Xu et al. | |
| 7,964,476 B2 | 6/2011 | Liu et al. | |
| 2002/0011641 A1 | 1/2002 | Oswald et al. | |
| 2002/0119592 A1 | 8/2002 | Oswald et al. | |

(Continued)

FOREIGN PATENT DOCUMENTS

| | | |
|---|---|---|
| EP | 2105969 | 9/2009 |
| WO | WO 0205352 | 1/2002 |

(Continued)

*Primary Examiner* — Dana Ross
*Assistant Examiner* — Lindsey C Staubach
(74) *Attorney, Agent, or Firm* — MacMillan, Sobanski & Todd, LLC

(57) ABSTRACT

Methods and systems for forming a scribe line in a thin film stack on an inner surface of a thin film photovoltaic superstrate are provided via the use of a cleaning laser beam and a scribing laser beam. The cleaning laser beam is focused directly onto the exposed surface of the superstrate such that the cleaning laser beam removes debris from the exposed surface of the superstrate, and the scribing laser beam is focused through the exposed surface of the superstrate and onto the thin film stack such that the scribing laser beam passes through the superstrate to form a scribe within the thin film stack on the inner surface of the superstrate. The method and system can further utilize a conveyor to transport the superstrate in a machine direction to move the superstrate past the cleaning laser source and the scribing laser source.

21 Claims, 7 Drawing Sheets

(56) References Cited

U.S. PATENT DOCUMENTS

| | | | |
|---|---|---|---|
| 2004/0219801 A1 | 11/2004 | Oswald et al. | |
| 2005/0148109 A1 | 7/2005 | Oswald et al. | |
| 2008/0029152 A1 | 2/2008 | Milshtein et al. | |
| 2008/0213978 A1* | 9/2008 | Henry | B08B 5/00 438/462 |
| 2008/0233715 A1 | 9/2008 | Liu et al. | |
| 2009/0145472 A1* | 6/2009 | Li | H01L 31/0465 136/244 |
| 2009/0239331 A1 | 9/2009 | Xu et al. | |
| 2010/0035375 A1 | 2/2010 | Grigoropoulos et al. | |
| 2010/0124619 A1 | 5/2010 | Xu et al. | |
| 2010/0320171 A1 | 12/2010 | Mao et al. | |
| 2011/0086204 A1 | 4/2011 | Wohl, Jr. et al. | |
| 2011/0155707 A1* | 6/2011 | Hsu | B23K 26/38 219/121.72 |
| 2011/0162684 A1 | 7/2011 | Kim et al. | |
| 2011/0171757 A1* | 7/2011 | Yamamuro | H01L 31/186 438/4 |
| 2011/0207328 A1 | 8/2011 | Speakman | |
| 2012/0074105 A1* | 3/2012 | Okamoto | B23K 26/146 219/121.62 |
| 2012/0234375 A1* | 9/2012 | Nakamura | H01L 31/0463 136/249 |

FOREIGN PATENT DOCUMENTS

| | | | |
|---|---|---|---|
| WO | WO 2008019066 | 2/2008 | |
| WO | WO 2008047144 | 4/2008 | |
| WO | WO 2008116134 | 9/2008 | |
| WO | WO 2011061950 A1 * | 5/2011 | H01L 31/035272 |

* cited by examiner

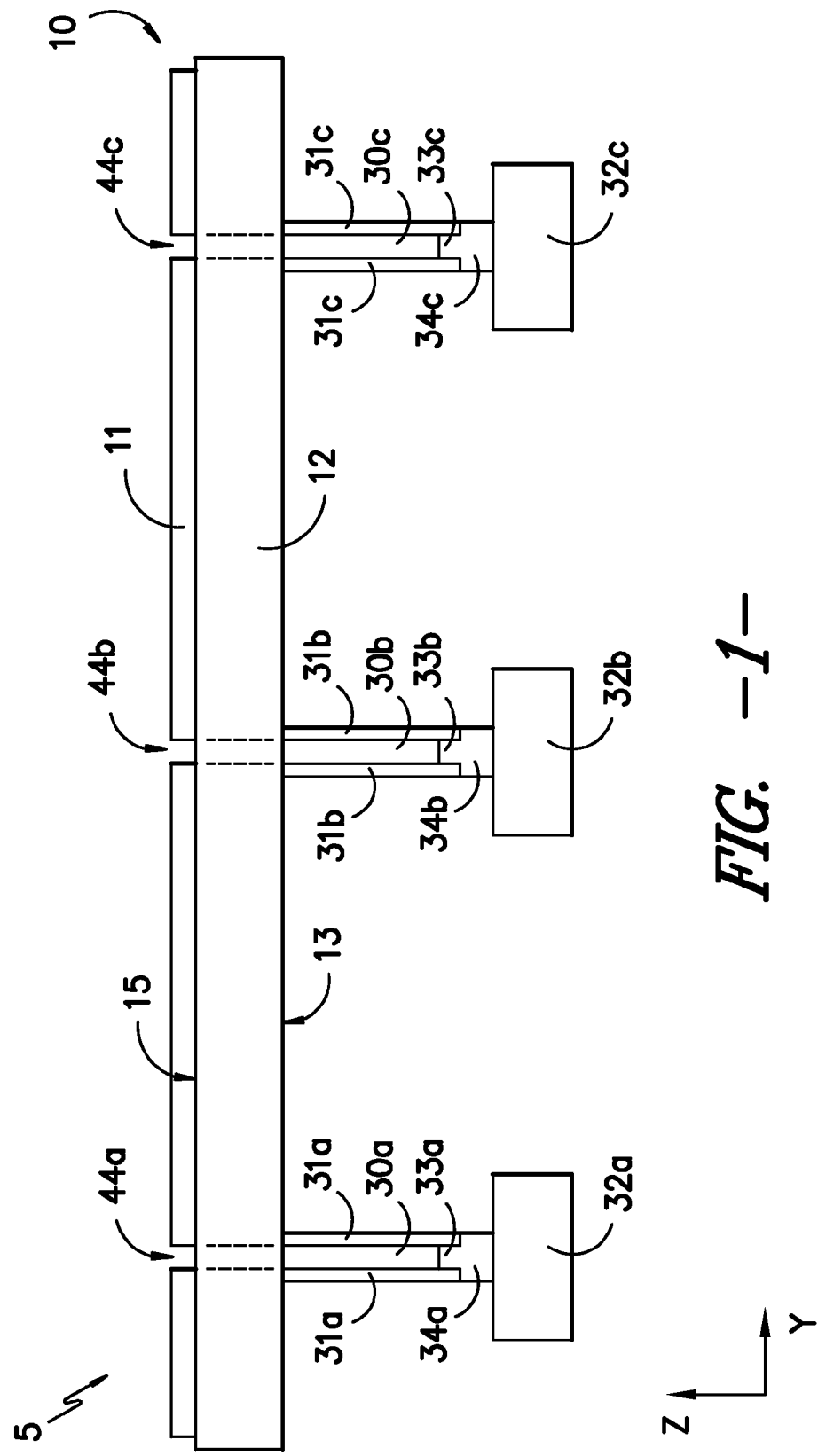
FIG. -1-

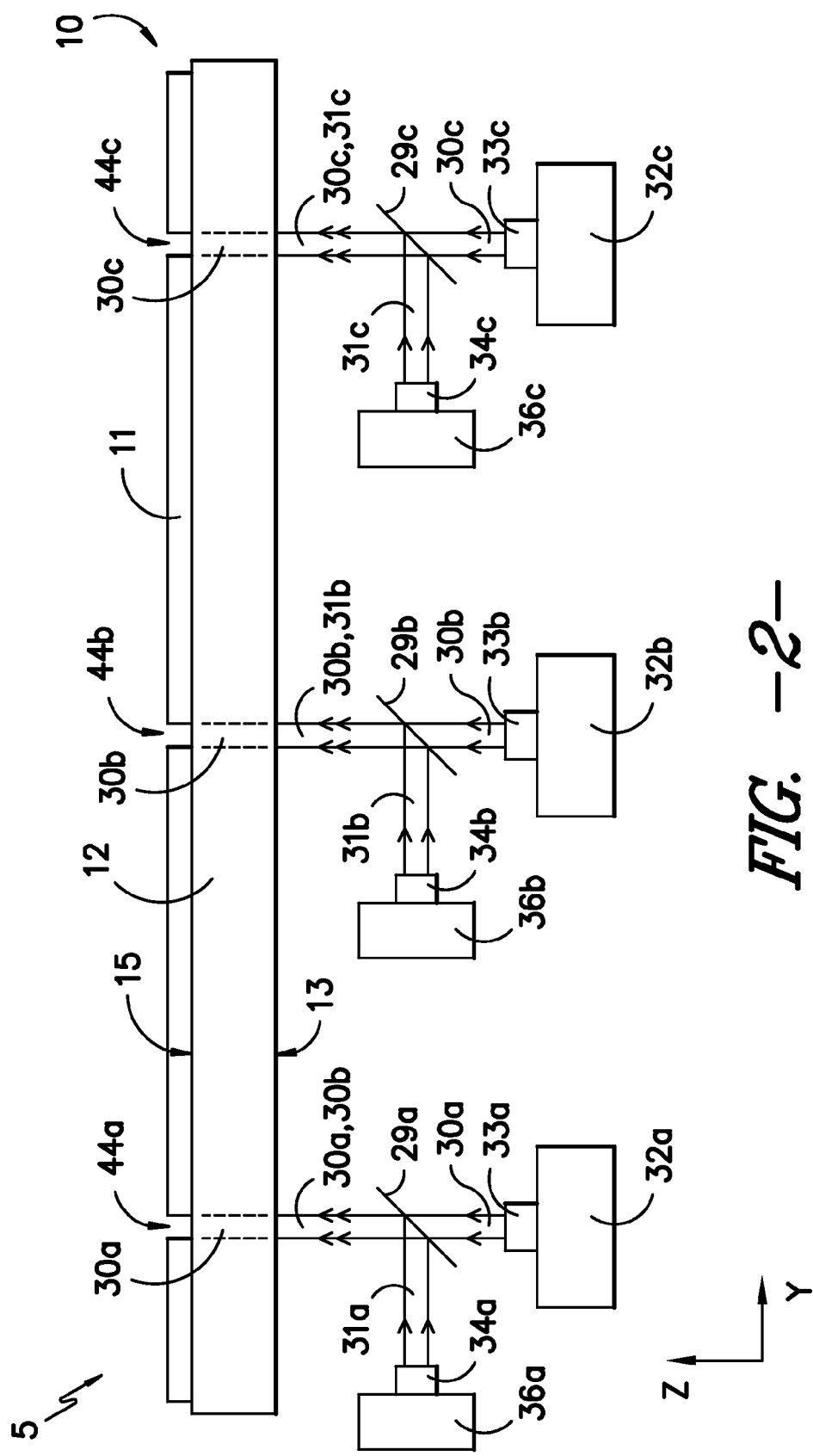
FIG. -2-

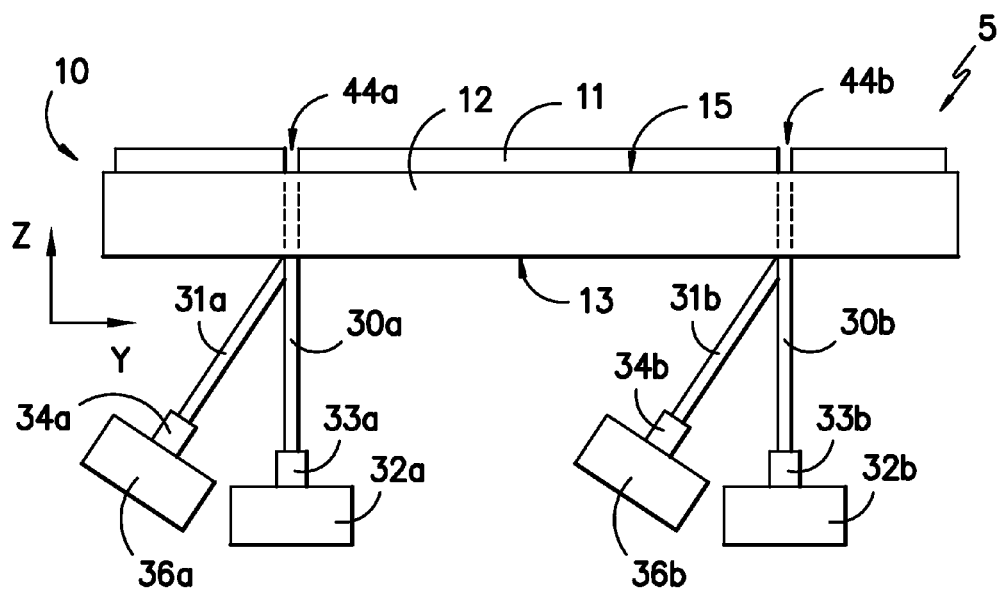
FIG. -3-
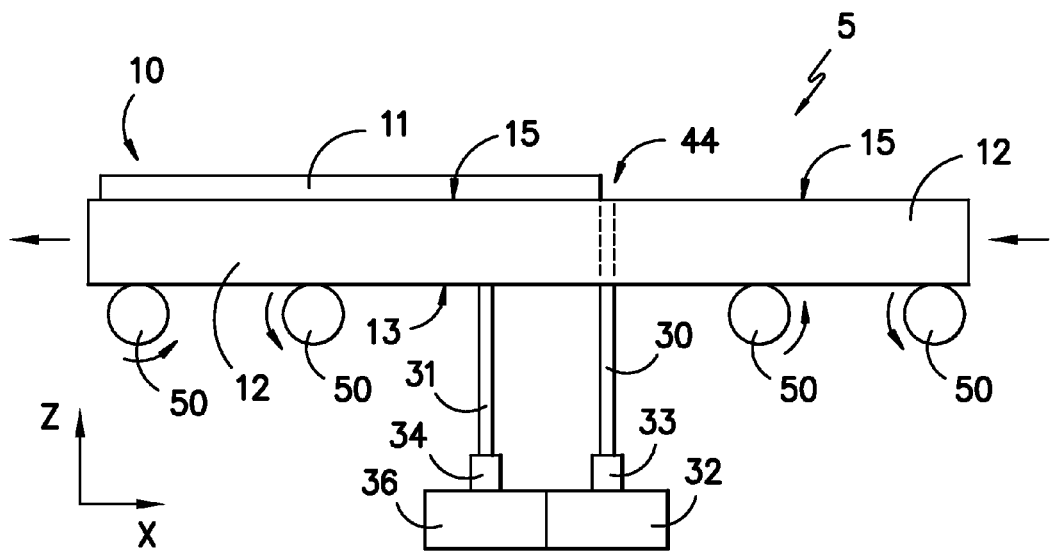
FIG. -4-

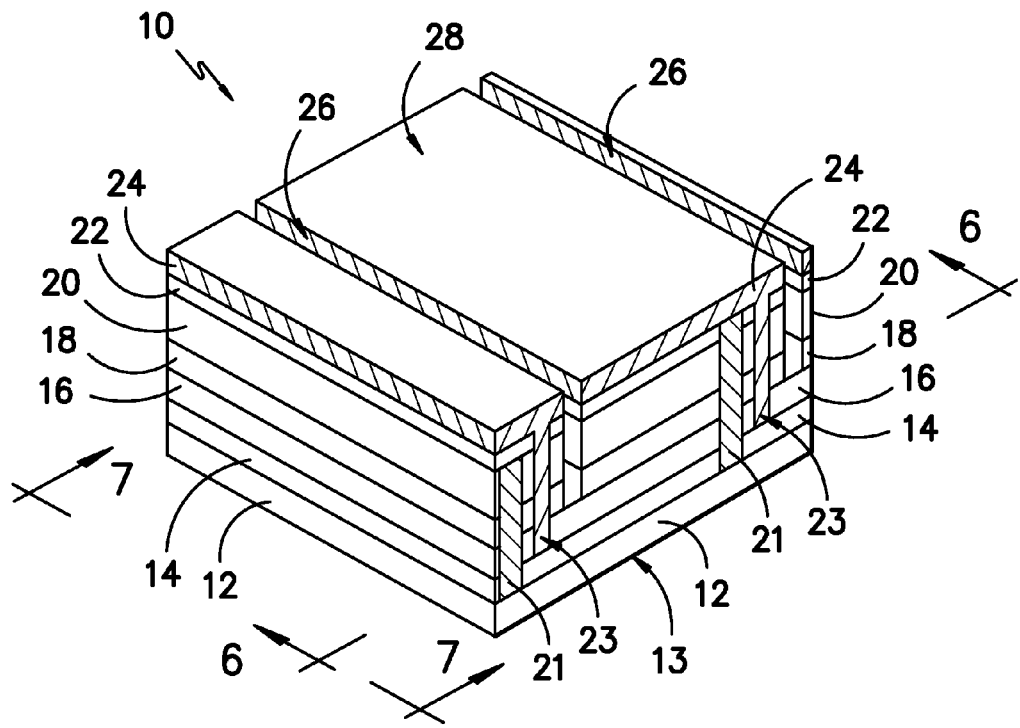
FIG. -5-
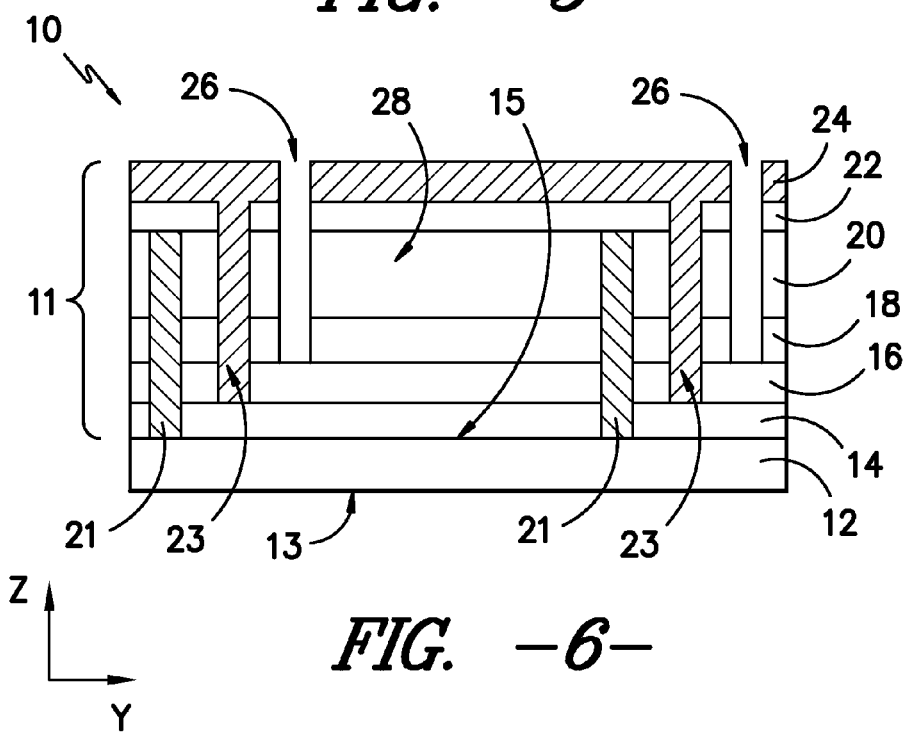
FIG. -6-

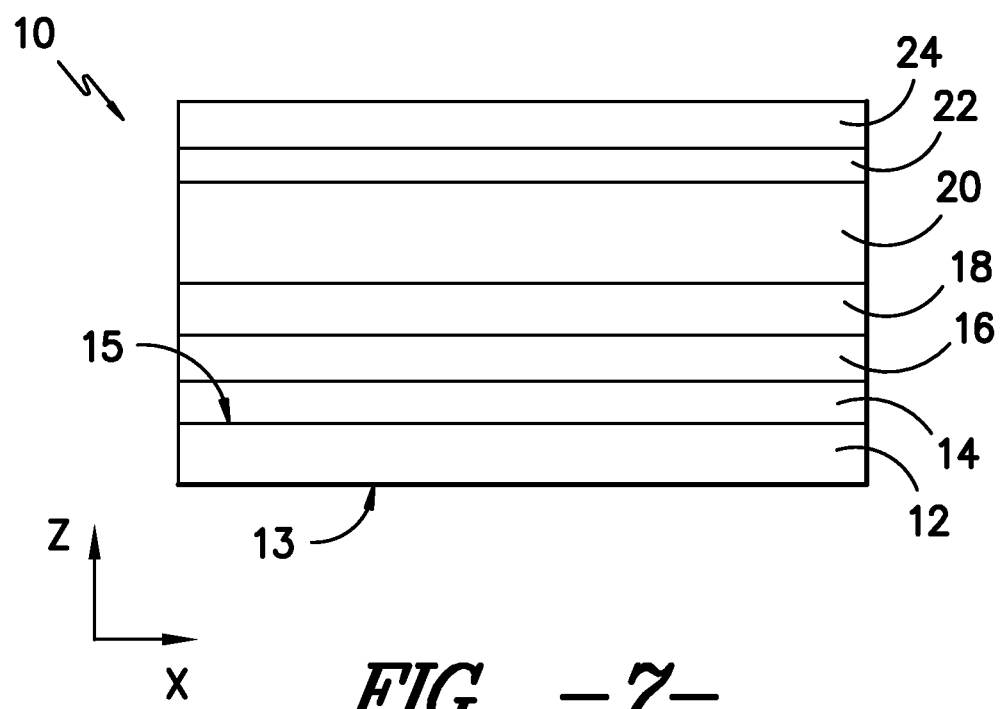
FIG. -7-

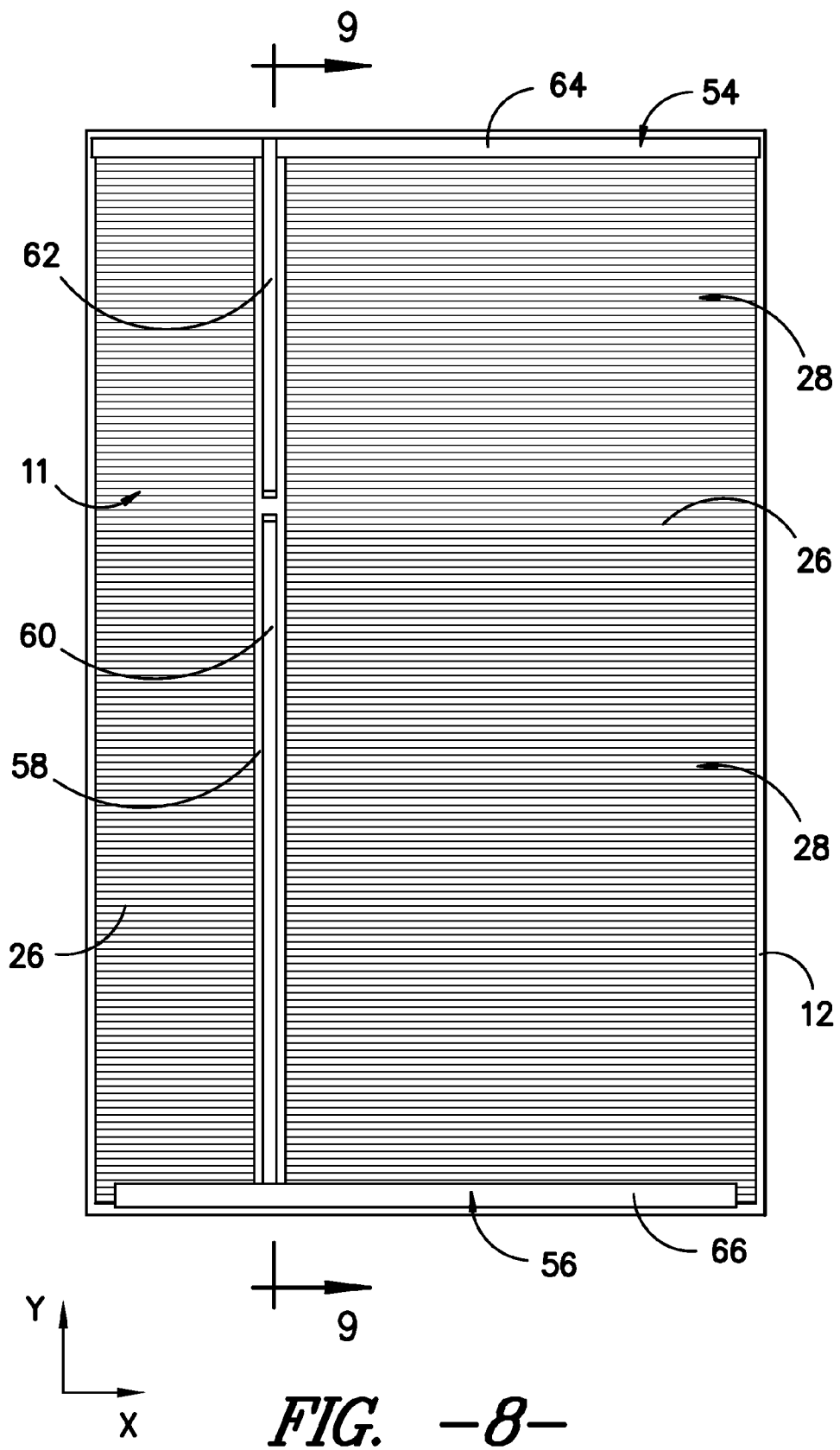
FIG. -8-

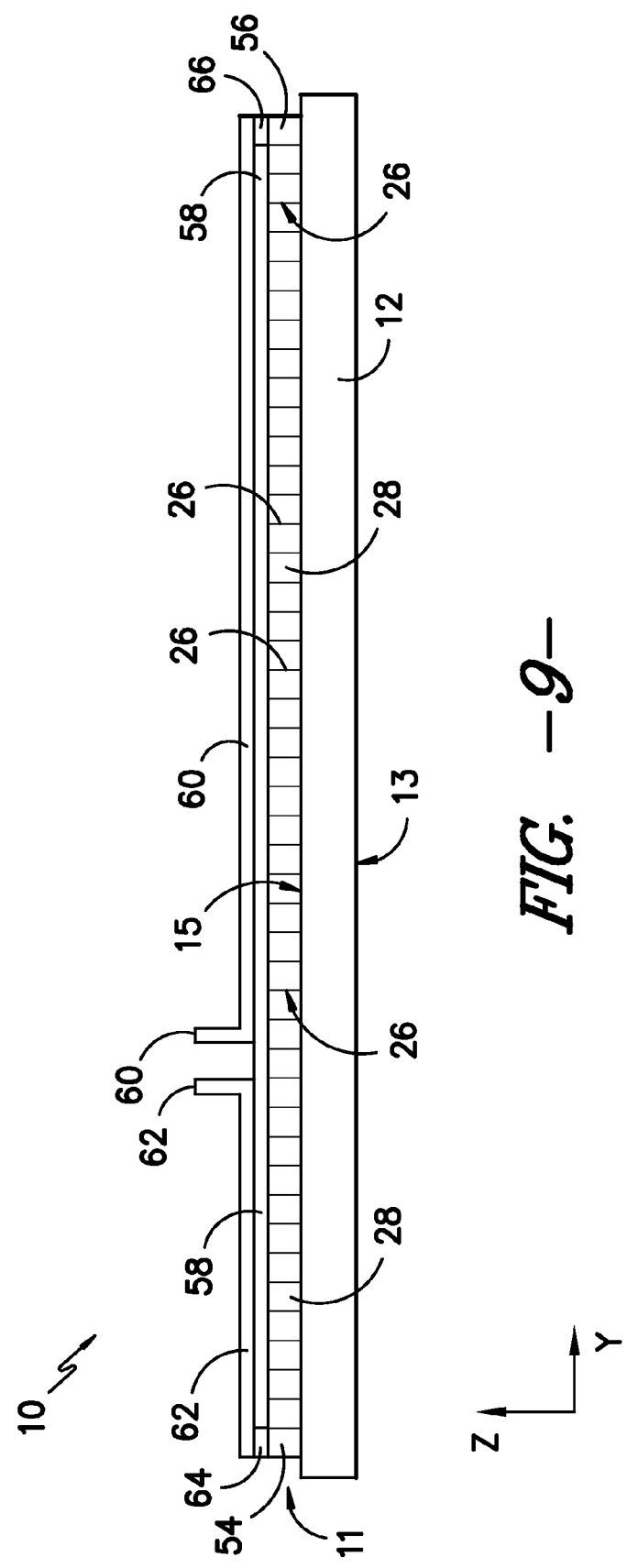

DUAL LASERS FOR REMOVING GLASS-SIDE DEBRIS DURING THE MANUFACTURE OF THIN FILM PHOTOVOLTAIC DEVICES

FIELD OF THE INVENTION

The subject matter disclosed herein relates generally to cleaning debris from the glass-side of a thin film photovoltaic device before or during laser scribing.

BACKGROUND OF THE INVENTION

Photovoltaic (PV) or solar cells are material junction devices which convert sunlight into direct current (DC) electrical power. When exposed to sunlight, the electric field of solar cell p-n junctions separates pairs of free electrons and holes, thus generating a photo-voltage. A circuit from n-side to p-side allows the flow of electrons when the solar cell is connected to an electrical load, while the area and other parameters of the PV cell junction device determine the available current. Electrical power is the product of the voltage times the current generated as the electrons and holes recombine.

Thin-film solar devices typically include multiple thin layers of material deposited on sheet glass, and are typically subdivided into a large number (between 100 and 200) of individual solar cells by scribing processes that also define the electrical interconnects for adjacent cells, which are electrically connected in series to produce power with a current. Laser scribing enables high-volume production of next-generation thin-film devices, and laser scribing out performs mechanical scribing methods in quality, speed, and reliability.

The laser-material interaction involves complex processes of heating, melting, vaporization, ejection of atoms, ions and molecules, shock waves, plasma initiation and plasma expansion. The resulting crater and laser-induced plasma are dependent on the laser beam parameters (e.g., duration, energy, and wavelength), the solid target properties, the surrounding environment's conditions, and, if passing through the superstrate, the condition and composition of the substrate (e.g., glass). For example, debris on the exposed surface of the superstrate (i.e., opposite from the thin film stack) can greatly affect the quality of the scribe line formed in the thin film stack, which can lead to shunting and other issues. Such issues can, in turn, lead to variations in performance of the resulting PV module.

As such, a need exists for more precisely laser scribing multiple thin films on a glass superstrate, especially cadmium telluride based thin film photovoltaic devices.

BRIEF DESCRIPTION OF THE INVENTION

Aspects and advantages of the invention will be set forth in part in the following description, or may be obvious from the description, or may be learned through practice of the invention.

Methods are generally provided, in one embodiment, of forming a scribe line in a thin film stack on an inner surface of a thin film photovoltaic superstrate that defines an exposed surface opposite from the inner surface. For example, a cleaning laser beam (e.g., generated by a cleaning laser source) can be focused directly onto the exposed surface of the superstrate such that the cleaning laser beam removes debris from the exposed surface of the superstrate, and a scribing laser beam (e.g., generated by a scribing laser source) can be focused through the exposed surface of the superstrate and onto the thin film stack such that the scribing laser beam passes through the superstrate to form a scribe within the thin film stack on the inner surface of the superstrate. In one embodiment, the method can further include transporting the superstrate in a machine direction to move the superstrate past the cleaning laser source and the scribing laser source.

Systems are also generally provided, in one embodiment, for forming a scribe line in a thin film stack on an inner surface of a thin film photovoltaic superstrate that defines an exposed surface opposite from the inner surface. For example, the system can include: a conveyor configured to transport the superstrate in a machine direction; a cleaning laser source configured to generate a cleaning laser beam focused directly onto the exposed surface of the superstrate to remove debris from the exposed surface of the superstrate; and a scribing laser source configured to generate a scribing laser beam through the exposed surface of the superstrate and focused on the inner surface of the superstrate in order to form a scribe within the thin film stack on the inner surface of the superstrate.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 shows an exemplary system for laser scribing thin films on a photovoltaic device according to one embodiment of the present invention;

FIG. 2 shows an exemplary system for laser scribing thin films on a photovoltaic device according to another embodiment of the present invention;

FIG. 3 shows an exemplary system for laser scribing thin films on a photovoltaic device according to yet another embodiment of the present invention;

FIG. 4 shows an exemplary system for laser scribing thin films on a photovoltaic device according to still another embodiment of the present invention;

FIG. 5 shows a perspective view of an exemplary cadmium telluride thin film photovoltaic device;

FIG. 6 shows a general schematic of a cross-sectional view of the exemplary cadmium telluride thin film photovoltaic device of FIG. 5;

FIG. 7 shows a general schematic of a cross-sectional view perpendicular to the view shown in FIG. 6 of the exemplary cadmium telluride thin film photovoltaic devices according to FIG. 5;

FIG. 8 shows a general schematic of an exemplary thin film photovoltaic device; and, FIG. 9 shows a cross-sectional view of the exemplary thin film photovoltaic device of FIG. 8.

Repeat use of reference characters in the present specification and drawings is intended to represent the same or analogous features or elements of the present invention.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers, unless otherwise stated. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Methods and systems are generally provided for isolating thin film photovoltaic cells on a superstrate, along with the resulting photovoltaic devices. In one embodiment, at least two lasers can be utilized to scribe a thin film stack on a transparent superstrate (e.g., a glass superstrate). Specifically, a cleaning laser beam can be focused onto an exposed surface of the superstrate in order to remove any debris therefrom (e.g., clean the exposed surface), and a scribing laser beam can be focused through the superstrate onto a thin film stack positioned on an inner surface of the superstrate. As used herein, the term "debris" refers to any material present on the substrate that could interrupt, reflect, redirect, or otherwise alter a scribing laser beam passing therethrough. Both of the laser beams can be directed across the width of the superstrate to form a scribe line during the formation, isolation, and/or subsequent electrical connection of individual photovoltaic cells in the thin film stack.

In particular, these methods and system can help avoid isolation failures in the scribing process forming the first and second isolation scribes (described in greater detail below) in order to avoid isolation failures in the through glass scribing process that could short adjacent photovoltaic cells in the device. For example, the methods and system can avoid a shunt created across an isolation scribe that would result in lowering the open circuit voltage of the device.

Exemplary embodiments of such methods and systems are discussed below with respect to the Figures.

Referring to FIGS. 1-4, a photovoltaic device 10 is generally shown having a thin film stack 11 over an inner surface 15 of the superstrate 12. In each of the laser scribing systems 5 shown in FIGS. 1-4, a cleaning laser beam 31 is directed toward and focused on the exposed surface 13 of the superstrate 12 (opposite from the inner surface 15 and the thin film stack 11) in order to remove debris from the substrate 12. Additionally, a scribe 44 is formed via a scribing laser beam 30, which is directed through the exposed surface 13 of the superstrate 12 and focused on the inner surface 15 of the superstrate 12 and/or the thin film stack 11. Due to the presence and focus of the cleaning laser beam 31 onto the exposed surface 13, the scribing laser beam 30 can pass through the exposed surface 13 without being interrupted by the presence of any debris thereon, allowing the scribing laser beam 30 to pass efficiently through the substrate 12. Thus, the scribing laser beam 30 can pass through the substrate 12 and form a substantially uniform scribe 44 in the thin film stack 11. It is believed, without wishing to be bound by any particular theory, that this method and system 5 produces a more uniform scribe 44 through the thin film stack 11, such as having a less jagged edge, when compared to a system and method not utilizing a cleaning laser beam 31. Thus, shunts can be avoided in the scribe lines 44 that could be harmful to the performance of the device 10, particularly in at least one of the scribe lines 21, 23, 26 described below.

In the embodiment shown in FIGS. 1 and 2, the cleaning laser beams 31a, 31b, 31c and the scribing laser beams 30a, 30b, 30c, respectively, are coaxial to each other when contacting the exposed surface 13 of the substrate 12.

Referring to FIG. 1, for example, the cleaning laser beams 31a, 31b, 31c forms a sheath surrounding the respective scribing laser beam 30a, 30b, 30c. Due to this configuration, the cleaning laser beams 31a, 31b, 31c can clean the exposed surface 13 allowing the scribing laser beams 30a, 30b, 30c to pass substantially uninterrupted therethrough forming a scribe line 44 as the superstrate 12 is transported (e.g., conveyed) in the machine direction (i.e., the x-direction perpendicular to both the z-direction and the y-direction).

The cleaning laser beams 31a, 31b, 31c are formed, respectively, by the cleaning laser sources 34a, 34b, 34c. Likewise, the scribing laser beams 30a, 30b, 30c are formed, respectively, by the scribing laser sources 33a, 33b, 33c. In the embodiment of FIG. 1, both of the cleaning laser sources 34a, 34b, 34c and the scribing laser sources 33a, 33b, 33c are different lenses of a single laser source 32a, 32b, 32c, with the cleaning laser sources 34a, 34b, 34c surrounding and the scribing laser sources 33a, 33b, 33c, respectively, in order to form the sheath/core relationship.

Alternatively, referring to the embodiment shown in FIG. 2, the cleaning laser beams 31a, 31b, 31c and the scribing laser beams 30a, 30b, 30c can be oriented from separate sources (i.e., the cleaning laser sources 36a, 36b, 36c and the scribing laser sources 32a, 32b, 32c, respectively) directed toward a beam collimator (e.g., a beam splitter). Such a beam collimator generally redirects the beams 30, 31 to be coaxial to each other. For example, the beam collimator can be a beam splitter (e.g., a prism, partially silvered mirror, etc.) as known in the art. In one particular embodiment, a coaxial beam can be directed toward the exposed surface 13 using a beam splitter that is antireflective (AR) coated for the wavelength (or wavelength range) desired to be transmitted with the other wavelengths being reflected.

FIG. 2 shows an exemplary system 5 in which the cleaning laser beams 31a, 31b, 31c and the scribing laser beams 30a, 30b, 30c, respectively, are directed to beam splitters 29a, 29b, 29c from their respective sources. As shown, at least a portion of the cleaning laser beams 31a, 31b, 31c are redirected by the respective beam splitters 29a, 29b, 29c towards the exposed surface 13, while at least a portion of the scribing laser beams 30a, 30b, 30c pass through, respectively, the beam splitters 29a, 29b, 29c towards the exposed surface 13. As such, the combined beams 30a, 31a; 30b, 31b; 30c, 31c are directed together towards the exposed surface allowing the cleaning laser beams 31a, 31b, 31c to clean the exposed surface 13 and the scribing laser beams 30a, 30b, 30c to pass therethrough.

It should be understood that, although shown having the cleaning laser beams 31 be redirected by the respective beam splitters 29 in the embodiment of FIG. 2, an alternative embodiment can have the scribing laser beams 30 redirected by the respective beam splitters 29 with the cleaning laser beams 31 passing therethough. Such an alternative embodiment can be formed by reversing the positioning of the cleaning laser source 34 and the scribing laser source 33.

In other embodiments, such as shown in the embodiments of FIGS. 3 and 4, the cleaning laser beam 31 and the scribing laser beam 30 can be non-coaxial to each other.

Referring to FIG. 3, the cleaning laser beams 31a, 31b and the scribing laser beams 30a, 30b, respectively, are non-parallel to each other. As shown, the scribing laser beams 30a, 30b, respectively, are formed by the scribing laser sources 32a, 32b which are directed substantially perpendicular to the exposed surface 13 (i.e., in the z-direction) such that the scribing laser beams 30a, 30b are focused via lenses 33a, 33b on the inner surface 15. Conversely, the cleaning laser beams 31a, 31b are formed, respectively, by the cleaning laser sources 36a, 36b which are directed at an angle (i.e., non-perpendicular to any of the z-, x-, and y-directions) onto the exposed surface 13 such that the cleaning laser beams 31a, 31b are focused via lenses 34a, 34b on the exposed surface 13.

In the orientations shown in FIGS. 1-3, the cleaning laser beams 31a, 31b, 31c and the scribing laser beams 30a, 30b, 30c, respectively, can be simultaneously directed toward substantially the same point on the exposed surface 13 of the superstrate 12. As stated, the cleaning laser beams 31a, 31b, 31c are focused onto the exposed surface 13 of the transparent superstrate 12, while the scribing laser beams 30a, 30b, 30c, respectively, are focused on the inner surface 15 of the superstrate 12 and onto the thin film stack 11 to form a scribe 44.

In the embodiment shown in FIG. 4, both the cleaning laser beam 31 and the scribing laser beam 30 are oriented substantially perpendicular to the exposed surface of the superstrate (i.e., in the z-direction), but are non-coaxial to each other. In particular, the cleaning laser beam 31 and the scribing laser beam 30 are sequentially directed toward the exposed surface 13 of the superstrate 12 as the superstrate 12 moves in the machine direction (i.e., in the x-direction) such that the cleaning laser beam 31 removes debris on the exposed surface 13 of the superstrate 12 prior to the scribing laser beam 30 forming the scribe 44 within the thin film stack 11. Such a sequential configuration can also allow for the substrate 12 to cool down to its initial temperature (e.g., a room temperature of about 20° C. to about 25° C.) prior to receiving the scribing laser beam 30 therethrough, so as to not substantially affect the path of the scribing laser beam 30 as it passes through the substrate 12.

In one embodiment, the cleaning laser beam 31 can be exposed to a particular point on the exposed surface 13 at least about 0.5 milliseconds (ms) prior to exposing that particular point on the exposed surface to the scribing laser beam 30. For example, the cleaning laser beam 31 can be exposed to a particular point on the exposed surface 13 about 1 millisecond (ms) to about 1 second prior to exposing that particular point on the exposed surface to the scribing laser beam 30 (e.g., about 5 ms to about 500 ms).

As shown, the scribing laser beam 30 is formed by the scribing laser source 32 directed substantially perpendicular to the exposed surface 13 (i.e., in the z-direction) such that the scribing laser beam 30 is focused via lens 33 on the inner surface 15. Conversely, the cleaning laser beam 31 is formed by the cleaning laser source 36 directed substantially perpendicular to the exposed surface 13 (i.e., in the z-direction) such that the cleaning laser beam 31 is focused via lens 34 on the exposed surface 13.

FIG. 4 also shows the rollers 50 transporting the superstrate 12 in the machine direction (i.e., in the x-direction). Although not shown in FIGS. 1-3, such rollers 50 can also be present to transport the superstrate 12 in the machine direction (i.e., in the x-direction that is perpendicular to the y-direction and to the z-direction). Additionally, although shown as rollers 50, any suitable transport mechanism can be utilized to transport or convey the superstrate 12 past the system 5 (e.g., a conveyor belt, a substrate holder, etc.). In one embodiment, the transport mechanism is configured to transport a plurality of the superstrates 12 in serial arrangement past the laser sources 32, 33 at a substantially constant rate in the machine direction (i.e., the x-direction).

In yet another embodiment, the lasers can be positioned sequentially with each other, while the cleaning laser beam 31 is non-perpendicular to the exposed surface 13 in order to increase the distance the laser beam would need to travel between the exposed surface 13 and the film 11 to reduce the effect of the cleaning laser beam 31 on the film 11.

The wavelength of the cleaning laser beam 31 can be selected upon the type of debris to be removed from the exposed surface 13 of the superstrate 12. Similarly, the wavelength of the scribing laser beam 30 can be selected depending on the type of scribe 44 to be formed in the film stack 11 and the components of the thin film layers within the thin film stack 11. For example, the cleaning laser beam can have a first wavelength, and the scribing laser beam can have a second wavelength. In certain embodiments, the first wavelength and the second wavelength are the same. In other embodiments, the first wavelength and the second wavelength are different.

For example, the cleaning laser beam can have a wavelength in the ultraviolet range (e.g., about 100 nm to about 500 nm), the visible range (e.g., about 400 nm to about 700 nm) and/or the infrared range (e.g., about 700 to about 1100 nm). Particularly suitable wavelengths for a cleaning laser beam can be, for instance, 266 nm and/or 355 nm. Alternatively, the scribing laser beam can have a wavelength of about 300 nm to about 1200 nm. Particularly suitable wavelengths for a scribing laser beam can be, for instance, 355 nm, 532 nm, and/or 1064 nm.

In one particular embodiment, the thin film stack 11 includes a transparent conductive oxide layer 14 on the inner surface 15, an optional resistive transparent buffer layer 16 on the transparent conductive oxide layer 14, an n-type window layer 18 (e.g., a cadmium sulfide layer) on the transparent conductive oxide layer 14, an absorber layer 20 (e.g., a cadmium telluride layer) on the n-type window layer 18, a graphite layer 22, and a metal contact layer 24. Collectively, the graphite layer 22 and metal contact layer 24 make up the back contact of the device 10. It is, however, to be understood that other material combinations could instead be used to form the back contact and that such combinations are considered to be within the scope of presently disclosed device, as shown in FIGS. 4-6 and discussed in greater detail below.

FIG. 4 shows one exemplary embodiment of the photovoltaic device 10 that generally includes a plurality of photovoltaic cells 28 separated by scribe lines 21, 23, 26, generally formed via a laser scribing process. For example, the laser scribing process can entail defining a first isolation scribe 21 (also known as a "P1 scribe") from the substrate 12 through the photo reactive layers (i.e., the n-type window layer 18 and the absorber layer 20), including the underlying layers (i.e., through the TCO layer 14). The first isolation scribe line 21 can then be filled with dielectric material before application of the back contact layers 22, 24 in order to ensure that the TCO layer 14 is electrically isolated between cells 28. For example, the first isolation scribe 21 can be filled using a photoresist development process wherein a liquid negative photoresist (NPR) material is coated onto the absorber layer 20 by spraying, roll coating, screen printing, or any other suitable application process. The substrate 12 is then exposed to light from below such that the NPR material in the first isolation scribes 21 (and any pinholes in the absorber material 20) are exposed to the light, causing the exposed NPR polymers to crosslink and "harden." The substrate 12 can then be "developed" in a process wherein a chemical developer is applied to the absorber layer 20 to dissolve any unhardened NPR material. In other words, the NPR material that was not exposed to the light is washed away from the absorber layer 20 by the developer, leaving the first isolation scribes 21 filled with the NPR material.

In one embodiment, where the device 10 has a transparent conductive oxide layer 14 that includes a cadmium tin oxide, especially in conjunction with a cadmium telluride (CdTe) absorber layer), a complete NPR (insulating) process is required after formation of the first isolation scribe (i.e., the P1 scribe). For the "exposure" step in the NPR process, the requirement is to leave behind a vertical CdTe sidewall. As such, the presently disclosed method for removing all of the TCO layer 14 and leave the absorber layer (e.g., CdTe) edges vertical is to work "through the glass" and at a wavelength that is preferentially absorbed in the TCO layer 14 at interface of the TCO layer 14 and the superstrate 12 in order to fracture the overlayers (e.g., up to the absorber layer 20) off by blowing up the TCO layer 14 at the superstrate 12 interface). When formed from a cadmium tin oxide, the absorption spectrum of the TCO layer 14 suggests a wavelength less than 375 nm would be particularly suitable (e.g., less than 370 nm). When used with a boro-silicate glass as the superstrate 12, the absorption spectrum of the boro-silicate glass suggests a wavelength of greater than 330 nm. As such, a wavelength range of between about 330 and about 375 nm for the first series isolation scribe (i.e., the P1 scribe) process is particular suitable only because of the combination of a TCO layer 14 that includes a cadmium tin oxide, and the use of a boro-silicate glass as the superstrate 12, and the NPR requirement to fill the scribe. However, these particular wavelengths would not be suitable for embodiments having a soda lime glass acting as the superstrate 12.

In one embodiment, after filling the first isolation scribes 21, the graphite layer 22 can be applied onto the absorber layer 20.

A series connecting scribe 23 (also known as a "P2 scribe") can then be laser cut through the graphite layer 22 to the TCO layer 14 and filled with the conductive metallic material of the metal contact layer 24 to electrically connect adjacent cells to each other in series. Of course, any conductive material can be included in the series connecting scribes 23. Specifically, the series connecting scribe 23 can allow the metal contact layer 24 to contact the TCO layer 14 providing a direct electrical connection between the back contact (e.g., the graphite layer 22 and the metal contact layer 24) and the front contact material (i.e., the TCO layer 14).

Finally, a second isolation scribe 26 can be laser cut through the back contact (i.e., the graphite layer 22 and the metal contact layer 24) and photo reactive layers (i.e., the n-type window layer 18 and the absorber layer 20) to isolate the back contact into individual cells.

The system 5 and methods of scribing discussed above can be utilized to form any or all of the scribe lines 21, 23, 26. In particular embodiments, the system 5 and methods are particularly suitable for forming the first isolation scribe 21 and/or the second isolation scribe 26 in order to avoid isolation failures in the through glass scribing process that could short adjacent cells.

As stated, the exemplary device 10 of FIGS. 1-2 includes superstrate 12 employed as the substrate on which the subsequent layers are formed, but it faces upwards to the radiation source (e.g., the sun) when the thin film photovoltaic device 10 is in used. The superstrate 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the superstrate 12 can be a borosilicate glass having a thickness of about 0.5 mm to about 2.5 mm. When using a borosilicate glass as the superstrate 12, the absorption spectra suggests that wavelengths of greater than about 330 nm are particularly suitable. As such, a laser beam having a wavelength of about 330 nm to about 370 nm can be particularly suitable for use with the combination of a borosilicate glass as the superstrate 12 with a TCO layer comprising a cadmium tin oxide (e.g., about 330 nm to about 365 nm, such as about 345 nm to about 360 nm).

The transparent conductive oxide (TCO) layer 14 is shown on the superstrate 12 of the exemplary device 10. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes, in one particular embodiment, at least one conductive oxide, such as tin oxide, zinc oxide, or indium tin oxide, or mixtures thereof. Additionally or alternatively, the TCO layer 14 can include other conductive, transparent materials. For example, the TCO layer 14 can include zinc stannate and/or cadmium stannate.

The TCO layer 14 can be formed by sputtering, chemical vapor deposition, spray pyrolysis, or any other suitable deposition method. In one particular embodiment, the TCO layer 14 can be formed by sputtering, either DC sputtering or RF sputtering, on the substrate 12. For example, a cadmium stannate layer can be formed by sputtering a hot-pressed target containing stoichiometric amounts of $SnO_2$ and CdO onto the substrate 12 in a ratio of about 1 to about 2. The cadmium stannate can alternatively be prepared by using cadmium acetate and tin (II) chloride precursors by spray pyrolysis.

In certain embodiments, the TCO layer 14 can have a thickness between about 0.1 μm and about 1 μm, for example from about 0.1 μm to about 0.5 μm, such as from about 0.25 μm to about 0.45 μm.

The optional resistive transparent buffer layer 16 (RTB layer) is shown on the TCO layer 14 on the exemplary thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the n-type window layer 18 can allow for a relatively thin n-type window layer 18 to be included in the device 10 by reducing the possibility of interface defects (i.e., "pinholes" in the n-type window layer 18) creating shunts between the TCO layer 14 and the absorber layer 20. Thus, it is believed that the RTB layer 16 allows for improved adhesion and/or interaction between the TCO layer 14 and the absorber layer 20, thereby allowing a relatively thin n-type window layer 18 to be formed thereon without significant adverse effects that would otherwise result from such a relatively thin n-type window layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pyrolysis, or any other suitable deposition method. In one particular embodiment, the RTB layer 16 can be formed by sputtering, either DC sputtering or RF sputtering, on the TCO layer 14. For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm.

The n-type window layer 18 is shown on resistive transparent buffer layer 16 of the exemplary device 10. In one particular embodiment, the n-type window layer 18 can generally include cadmium sulfide (CdS) but may also include other materials, such as zinc sulfide, cadmium zinc sulfide, etc., and mixtures thereof as well as dopants and other impurities. As such, the n-type window layer 18 may be referred to as a cadmium sulfide layer, when primarily composed of cadmium sulfide. In one particular embodiment, the cadmium sulfide layer may include oxygen up to about 25% by atomic percentage, for example from about 5% to about 20% by atomic percentage. The n-type window layer 18 can have a wide band gap (e.g., from about 2.25 eV to about 2.5 eV, such as about 2.4 eV) in order to allow most radiation energy (e.g., solar radiation) to pass. As such, the n-type window layer 18 is considered a transparent layer on the device 10.

The n-type window layer 18 can be formed by sputtering, chemical vapor deposition, chemical bath deposition, and other suitable deposition methods. In one particular embodiment, the n-type window layer 18 can be formed by sputtering, either direct current (DC) sputtering or radio frequency (RF) sputtering, on the resistive transparent buffer layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent buffer layer 16, the n-type window layer 18 can have a thickness that is less than about 0.1 μm, such as between about 10 nm and about 100 nm, such as from about 40 nm to about 80 nm, with a minimal presence of pinholes between the resistive transparent buffer layer 16 and the n-type window layer 18. Additionally, a n-type window layer 18 having a thickness less than about 0.1 μm reduces any adsorption of radiation energy by the n-type window layer 18, effectively increasing the amount of radiation energy reaching the underlying absorber layer 20.

The absorber layer 20 is a p-type layer that interacts with the n-type window layer 18 (e.g., a cadmium sulfide layer) to produce current from the adsorption of radiation energy by absorbing the majority of the radiation energy passing into the device 10 due to its high absorption coefficient and creating electron-hole pairs. In one particular embodiment, the absorber layer 20 generally includes cadmium telluride (CdTe) but may also include other materials (also referred to as a cadmium telluride layer). For example, the absorber layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the absorber layer 20 (e.g., a cadmium telluride layer) across the junction to the n-type window layer 18 (e.g., a cadmium sulfide layer 18) and, conversely, holes may pass from the n-type window layer 18 to the absorber layer 20. Thus, the p-n junction formed between the n-type window layer 18 and the absorber layer 20 forms a diode in which the charge imbalance leads to the creation of an electric field spanning the p-n junction. Conventional current is allowed to flow in only one direction and separates the light induced electron-hole pairs.

The absorber layer 20 can be formed by any known process, such as vapor transport deposition, chemical vapor deposition (CVD), spray pyrolysis, electro-deposition, sputtering, close-space sublimation (CSS), etc. In one particular embodiment, the n-type window layer 18 is deposited by a sputtering and the absorber layer 20 is deposited by close-space sublimation. In particular embodiments, the absorber layer 20 can have a thickness between about 0.1 µm and about 10 µm, such as from about 1 µm and about 5 µm. In one particular embodiment, the absorber layer 20 can have a thickness between about 2 µm and about 4 µm, such as about 3 µm.

A series of post-forming treatments can be applied to the exposed surface of the absorber layer 20. For example, when the absorber layer 20 includes cadmium telluride, these treatments can tailor the functionality of the cadmium telluride layer 20 and prepare its surface for subsequent adhesion to the back contact layers 22 and 24. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 20 (and the device 10) converts the normally n-type cadmium telluride layer 20 to a p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as CdO, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 by any process. For example, copper can be sprayed or washed on the surface of the cadmium telluride layer 20 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

The back contact is formed from the graphite layer 22 and the metal contact layer 24 shown on the absorber layer 20 and generally serves as the back electrical contact, in relation to the opposite, TCO layer 14 serving as the front electrical contact. The back contact is formed on, and in one embodiment is in direct contact with, the cadmium telluride layer 20.

The graphite layer 22 can include a polymer blend or a carbon paste and can be applied to the semiconductor device by any suitable method for spreading the blend or paste, such as screen printing, spraying or by a "doctor" blade. After the application of the graphite blend or carbon paste, the device 10 can be heated to convert the blend or paste into the conductive graphite layer 22. The graphite layer 22 can be, in particular embodiments, from about 0.1 µm to about 10 µm in thickness, for example from about 1 µm to about 5 µm.

The metal contact layer 24 is suitably made from one or more highly conductive materials, such as elemental nickel, chromium, copper, tin, aluminum, gold, silver, technetium or alloys or mixtures thereof. The metal contact layer 24, if made of or comprising one or more metals, is suitably applied by a technique such as sputtering or metal evaporation. The metal contact layer 24 can be from about 0.1 µm to about 1.5 µm in thickness.

Other layers may also be present in the thin film stack 11, although not specifically shown in the embodiment of FIGS. 4-6. For example, index matching layers may be present between the transparent conductive oxide layer 14 and the inner surface 15 of the superstrate 12. Additionally, an oxygen getter layer may be present in the thin film stack 11, such as adjacent to the transparent conductive oxide layer 14 (e.g., between the transparent conductive oxide layer 14 and the optional resistive transparent buffer layer 16).

Other components (not shown) can be included in the exemplary device 10, such as buss bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects.

For example, FIGS. 7 and 8 show an exemplary thin film photovoltaic device 10 that includes a plurality of photovoltaic cells 28 separated by scribe lines 26. It is noted that the scribe lines 26 shown are actually the three scribe lines 21, 23, and 26 discussed above. However, due to the presence of the metal contact layer 24 covering the first isolation scribe 21 and filling the series connecting scribe 23, only the second isolation scribe lines 26 are visible and thus appear to be a single line in the device 10.

As stated, the thin film stack 11 defines individual solar cells 28 (also referred to as photovoltaic cells) separated by scribes 26 to collectively form a plurality of serially connected solar cells. Specifically, the individual photovoltaic cells 28 are electrically connected together in series. The plurality of serially connected solar cells 28 are between a dead cell 54 and a terminal cell 56. As shown, the dead cell 54 and the terminal cell 56 are positioned on opposite ends of the plurality of serially connected solar cells 28 in the y-direction of the device 10. The back contact of the dead cell 54 serves as an electrical connector for the device 10, while the TCO layer of the terminal cell 56 serves as the opposite electrical connector for the device 10. As such, the dead cell 54 does not produce a charge in its the thin film stack 11, while the terminal cell 56 may.

For instance, FIG. 3 generally shows a top view of an exemplary thin film photovoltaic device 10 defining a plurality of photovoltaic cells 28 separated by scribes 26. The scribes 26 can be, in one embodiment, substantially parallel to each other such that the photovoltaic cells 28 are substantially the same size. As shown, each of the scribes 26 is generally oriented in the x-direction.

An insulating layer 58 is on the thin film stack 11 to protect the back contact 22, 24 of the thin film stack 11, as shown in FIG. 1. The insulating layer 58 generally includes an insulating material that can prevent electrical conductivity therethrough. Any suitable material can be used to produce the insulating layer 58. In one embodiment, the insulating layer 58 can be an insulating polymeric film coated on both surfaces with an adhesive coating. The adhesive coating can allow for adhesion of the insulating layer 58 to the underlying thin film stack 11 and for the adhesion of the conductive strip 60, 62 to the insulating layer 58. For example, the insulating layer 58 can include a polymeric film of polyethylene terephthalate (PET) having an adhesive coating on either surface. The adhesive coating can be, for example, an acrylic adhesive, such as a thermosetting acrylic adhesive.

In one particular embodiment, the insulating layer 58 is a strip of insulating material generally oriented in a direction substantially perpendicular to the orientation of the scribes 26. For example, as shown in FIG. 7, the insulating layer 58 can be generally oriented in the y-direction that is substantially perpendicular to the orientation of the scribes 26 in the x-direction.

The insulating layer 58 can have a thickness in the z-direction suitable to prevent electrical conductivity from the underlying thin film layers, particularly the back contact, to any subsequently applied layers. In one particular embodiment, the insulating layer 58 can prevent electrically conductivity between the thin film stack 11 and the conductive strips 60, 62.

The conductive strips 60, 62, in one embodiment, can be applied as a continuous strip over the insulating layer 38, and then severed to produce a first lead 40 and a second lead 42, as shown in FIGS. 7-8. The conductive strips 60, 62 can be constructed from any suitable material. In one particular embodiment, the conductive strips 60, 62 is a strip of metal foil. For example, the metal foil can include a conductive metal.

Bus bars 64, 66 can then be attached over the terminal cell 56 and the dead cell 54, respectively, of the photovoltaic device 10 to serve as an opposite electrical connections. The encapsulating substrate (not shown) can be adhered to the photovoltaic device 10 via an adhesive layer (not shown). The adhesive layer is generally positioned over the conductive strips 60, 62, the insulating layer 58, and any remaining exposed areas of the thin film stack 11. For example, the adhesive layer can define an adhesive gap that generally corresponds to a connection aperture defined by the encapsulating substrate. As such, the first lead 60 and second lead 62 can extend through the adhesive gap. The adhesive layer can generally protect the thin film stack 11 and attach the encapsulating substrate to the device 10. The adhesive layer can be constructed from ethylene vinyl acetate (EVA), polyvinyl butyral (PVB), silicone based adhesives, or other adhesives which are configured to prevent moisture from penetrating the device.

A junction box (not shown) can also be included in the device and can be configured to electrically connect the photovoltaic device 10 by completing the DC circuit.

However, other configurations can be used to form the thin film photovoltaic device 10, such as a three terminal thin film device.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of forming a scribe line in a thin film stack on an inner surface of a thin film photovoltaic superstrate, wherein the superstrate defines an exposed surface opposite from the inner surface, the method comprising:
   focusing a cleaning laser beam generated by a cleaning laser source directly onto the exposed surface of the superstrate such that the cleaning laser beam removes debris from the exposed surface of the superstrate; and,
   focusing a scribing laser beam generated by a scribing laser source through the exposed surface of the superstrate and onto the thin film stack such that the scribing laser beam passes through the superstrate to form a scribe within the thin film stack on the inner surface of the superstrate.

2. The method as in claim 1, further comprising:
   transporting the superstrate in a machine direction to move the superstrate past the cleaning laser source and the scribing laser source.

3. The method as in claim 1, wherein the cleaning laser beam is oriented at an angle with respect to the exposed surface of the superstrate.

4. The method as in claim 3, wherein the scribing laser beam is oriented substantially perpendicular to the exposed surface of the superstrate.

5. The method as in claim 1, wherein the cleaning laser beam and the scribing laser beam are sequentially directed toward the exposed surface of the superstrate such that the cleaning laser beam removes debris on the exposed surface of the superstrate prior to the scribing laser beam forming the scribe within the thin film stack.

6. The method as in claim 1, wherein the cleaning laser beam has a first wavelength and the scribing laser beam has a second wavelength, and wherein the first wavelength and the second wavelength are different.

7. The method as in claim 6, wherein the first wavelength is about 100 nm to about 500 nm.

8. The method as in claim 1, wherein focusing the cleaning laser beam onto the exposed surface of the superstrate to remove debris results in a cleaned, exposed surface of the superstrate; and focusing the scribing laser beam further includes passing the scribing laser beam through the cleaned, exposed surface of the superstrate.

9. A method of forming a scribe line in a thin film stack on an inner surface of a thin film photovoltaic superstrate, wherein the superstrate defines an exposed surface opposite from the inner surface, the method comprising:
focusing a cleaning laser beam generated by a cleaning laser source directly onto the exposed surface of the superstrate such that the cleaning laser beam removes debris from the exposed surface of the superstrate; and,
focusing a scribing laser beam generated by a scribing laser source through the exposed surface of the superstrate and onto the thin film stack such that the scribing laser beam passes through the superstrate to form a scribe within the thin film stack on the inner surface of the superstrate,
wherein the cleaning laser beam and the scribing laser beam are coaxial to each other when contacting the exposed surface of the superstrate.

10. The method as in claim 9, wherein the cleaning laser beam forms a sheath surrounding the scribing laser beam.

11. The method as in claim 9, wherein the cleaning laser beam and the scribing laser beam are oriented substantially perpendicular to the exposed surface of the superstrate.

12. The method as in claim 9, wherein the at least a portion of the cleaning laser beam is reflected off of a beam splitter and redirected toward the exposed surface of the superstrate, and wherein at least a portion of the scribing laser beam passes through the beam splitter toward the exposed surface of the superstrate.

13. The method as in claim 9, wherein the at least a portion of the scribing laser beam is reflected off of a beam splitter and redirected toward the exposed surface of the superstrate, and wherein at least a portion of the cleaning laser beam passes through the beam splitter toward the exposed surface of the superstrate.

14. A system for forming a scribe line in a thin film stack on an inner surface of a thin film photovoltaic superstrate, wherein the superstrate defines an exposed surface opposite from the inner surface, the system comprising:
a conveyor configured to transport the superstrate in a machine direction;
a cleaning laser source configured to generate a cleaning laser beam focused directly onto the exposed surface of the superstrate to remove debris from the exposed surface of the superstrate; and,
a scribing laser source configured to generate a scribing laser beam through the exposed surface of the superstrate and focused on the inner surface of the superstrate in order to form a scribe within the thin film stack on the inner surface of the superstrate.

15. The system as in claim 14, wherein the cleaning laser source and the scribing laser source are sequentially positioned such that the superstrate is exposed to the cleaning laser beam prior to the scribing laser beam.

16. The system as in claim 14, wherein the cleaning laser beam is oriented at an angle with respect to the exposed surface of the superstrate.

17. A system for forming a scribe line in a thin film stack on an inner surface of a thin film photovoltaic superstrate, wherein the superstrate defines an exposed surface opposite from the inner surface, the system comprising:
a conveyor configured to transport the superstrate in a machine direction;
a cleaning laser source configured to generate a cleaning laser beam focused directly onto the exposed surface of the superstrate to remove debris from the exposed surface of the superstrate; and,
a scribing laser source configured to generate a scribing laser beam through the exposed surface of the superstrate and focused on the inner surface of the superstrate in order to form a scribe within the thin film stack on the inner surface of the superstrate;
wherein the cleaning laser beam and the scribing laser beam are coaxial to each other when contacting the exposed surface of the superstrate.

18. The system as in claim 17, wherein the cleaning laser beam forms a sheath surrounding the scribing laser beam.

19. The system as in claim 17, wherein the cleaning laser beam and the scribing laser beam are oriented substantially perpendicular to the exposed surface of the superstrate.

20. The system as in claim 17, further comprising:
a beam splitter, wherein the at least a portion of the cleaning laser beam is reflected off of the beam splitter and redirected toward the exposed surface of the superstrate, and wherein at least a portion of the scribing laser beam passes through the beam splitter toward the exposed surface of the superstrate.

21. The system as in claim 17, further comprising:
a beam splitter, wherein the at least a portion of the scribing laser beam is reflected off of the beam splitter and redirected toward the exposed surface of the superstrate, and wherein at least a portion of the cleaning laser beam passes through the beam splitter toward the exposed surface of the superstrate.

* * * * *